US005303184A

United States Patent [19]

[11] Patent Number: 5,303,184

[45] Date of Patent: Apr. 12, 1994

Noda

[54] NON-VOLATILE SEMICONDUCTOR MEMORY HAVING COMMONLY USED SOURCE OR DRAIN REGIONS OF FLOATING GATE TYPE TRANSISTORS

[75] Inventor: Masanori Noda, Kanagawa, Japan

[73] Assignee: Sony Corporation, Tokyo, Japan

[21] Appl. No.: 799,195

[22] Filed: Nov. 27, 1991

[30] Foreign Application Priority Data

Nov. 30, 1990 [JP] Japan ................................ 2-338491

[51] Int. Cl.[5] ...................... G11C 11/34; G11C 16/02

[52] U.S. Cl. .................................. 365/185; 257/316; 365/104

[58] Field of Search ................. 365/185, 104; 257/316

[56] References Cited

U.S. PATENT DOCUMENTS 4,281,397 7/1981 Neal et al. .
4,636,979 1/1987 Donoghue ......................... 365/104
4,758,989 6/1988 Davis et al. .................... 365/189.01
4,788,663 11/1988 Tanaka et al. ...................... 365/185
4,839,705 6/1989 Tigelaar et al. ..................... 365/185
4,901,285 2/1990 Sano et al. ......................... 365/104
4,982,377 1/1991 Iwasa ................................. 365/185
5,031,011 7/1991 Aritome et al. ...................... 365/185
5,031,148 7/1991 Kitazawa et al. ................... 365/185
5,079,603 1/1992 Komori et al. ....................... 257/316

*Primary Examiner*—Eugene R. LaRoche
*Assistant Examiner*—Michael C. Kessell
*Attorney, Agent, or Firm*—Hill, Steadman & Simpson

[57] ABSTRACT

A non-volatile semiconductor memory is provided having a memory cell formed in a semiconductor substrate and arranged in rows and columns to form an X-character shape array. Each cell includes a control electrode and a first region and a second region having a conductivity-type different from that of the substrate. Alternate first and second column lines are provided wherein the first region and the second region of each cell in each column are coupled to the first column line and the second column line, respectively. The first column lines selectively function as ground lines for inputting data during a data writing mode. The first column lines function as bit lines, and the second column lines function as ground lines for outputting data during a data reading mode.

3 Claims, 3 Drawing Sheets

NON-VOLATILE SEMICONDUCTOR MEMORY HAVING COMMONLY USED SOURCE OR DRAIN REGIONS OF FLOATING GATE TYPE TRANSISTORS

BACKGROUND OF THE INVENTION

1. Field of the Invention

The invention relates to a non-volatile semiconductor memory.

2. Description of the Prior Art

An EPROM (Erasable and Programmable Read Only Memory) is a non-volatile rewritable read only memory. In the EPROM, data is stored by accumulating charges into a floating gate and data is erased by escaping the charges accumulated in the floating gate to the outside by irradiating ultraviolet rays.

To realize a large capacity of the EPROM, in addition to the realization of a high integration density of memory cells by reducing an area of each memory cell, it is necessary to accomplish both the improvement of the writing characteristic and the improvement of the reading reliability by the improvement of the soft write (phenomenon such that a writing operation gradually occurs upon reading) resistance.

As a prior art literature of the invention, there can be mentioned the literature of ISSCC 80, page 146 which disclose an EPROM having what is called an X cell structure in which memory cells are arranged like an X-character.

When data is written in the EPROM, a program voltage $V_{pp}$ is applied to a control gate and a drain region and hot carriers generated by an avalanche breakdown or hot carriers generated in a channel portion are injected into a floating gate, thereby changing a threshold voltage $V_{th}$ of a memory transistor.

In the EPROM, on the other hand, when data is read out as well, a voltage is applied to the control gate and the drain region. Therefore, even when data is read out, hot carriers generated in portions near the drain region are likely to be injected into the floating gate. Particularly, in the case of using the EPROM for a long time, consequently, there is a problem such that the soft write occurs and a fluctuation of the threshold voltage $V_{th}$ of the memory transistor is caused and the reading reliability deteriorates.

To improve the soft write resistance, a method whereby the memory transistor is formed so as to have an LDD (Lightly Doped Drain) structure is considered. If the above method is used, however, since a field concentration near the drain region is weakened, the hot carriers are hardly injected into the floating gate. Thus, there is a problem such that the writing characteristic deteriorates.

OBJECTS AND SUMMARY OF THE INVENTION

It is, therefore, an object of the invention to provide a non-volatile semiconductor memory having an excellent writing characteristic, a high reading reliability, and a large capacity.

According to an aspect of the present invention, there is provided a non-volatile semiconductor memory having transistors constructing memory cells which are arranged in an X-character shape while commonly using a source region or a drain region, wherein one of a pair of semiconductor regions constructing the source region and the drain region comprises a high impurity concentration region and a low impurity concentration region, the other one of the pair of semiconductor regions constructing the source region and the drain region comprises a high impurity concentration region, the one of the semiconductor regions is used as a source region in a data writing mode, and the other one of the semiconductor regions is used as a drain region in a data reading mode.

The above and other objects, features, and advantages of the present invention will become readily apparent from the following detailed description thereof which is to be read in connection with the accompanying drawings.

DETAILED DESCRIPTION OF THE PREFERRED EMBODIMENT

An embodiment of the invention will be described hereinbelow with reference to the drawings.

Figure 2:
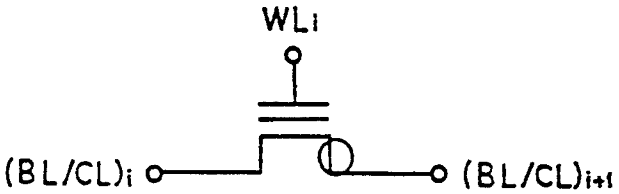
FIG. 2 is an equivalent circuit diagram showing a memory transistor which is used in the EPROM according to the embodiment of the invention and in which a source region and a drain region have asymmetrical structures.

An EPROM according to the embodiment uses a memory transistor in which one of a pair of semiconductor regions constructing a source region and a drain region comprises a high impurity concentration region and a low impurity concentration region and the other semiconductor region comprises a high impurity concentration region, that is, a memory transistor in which a source region and a drain region have asymmetrical structures. The memory transistor in which a source region and a drain region have asymmetrical structures as mentioned above is indicated by a symbol as shown in FIG. 2. In FIG. 2, the source region or drain region side comprising the high impurity concentration region and the low impurity concentration region is added with a mark "o".

Figure 1:
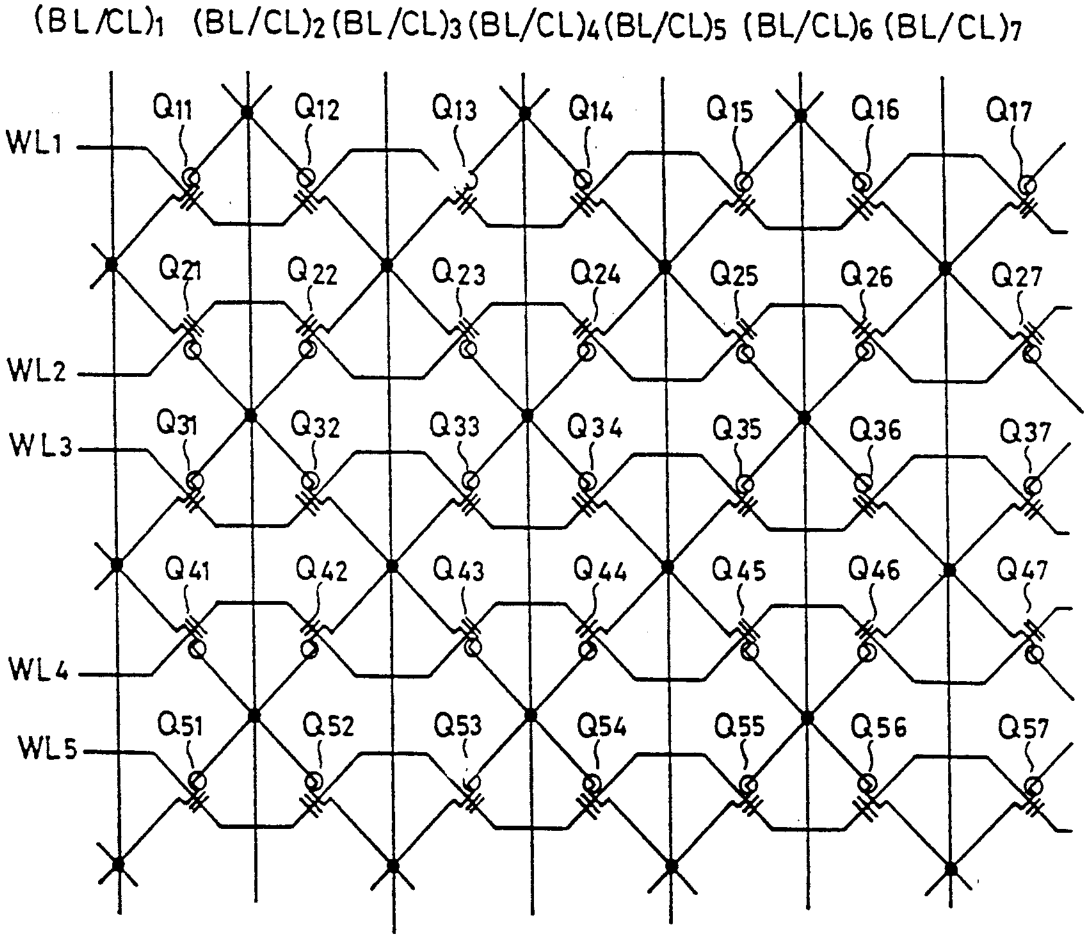
FIG. 1 is a schematic diagram showing a structure of an EPROM according to an embodiment of the invention.

FIG. 1 shows the EPROM according to an embodiment of the invention.

In FIG. 1, $WL_1$, $WL_2$, $WL_3$, $WL_4$, $WL_5$, . . . denote word lines which are used as control gates. $(BL/CL)_1$, $(BL/CL)_2$, $(BL/CL)_3$, $(BL/CL)_4$, $(BL/CL)_5$, $(BL/CL)_6$, $(BL/CL)_7$, . . . denote wirings which are used as bit lines or common lines.

The word lines $WL_i$ (i=1, 2, 3, . . . ) are formed by a polycrystalline silicon (Si) film in which impurities of, for instance, phosphorus (P) have been doped, a polycide film which is formed by overlaying a refractory metal silicide film such as a tungsten silicide ($WSi_x$) film onto a polycrystalline Si film in which such impurities have been doped, or the like. The wirings $(BL/CL)_i$ which are used as bit lines or common lines are formed by a metal film such as an aluminum (Al) film.

$Q_{ij}$ (i, j=1, 2, 3, . . . ) denote memory transistors. As already mentioned above, each of the memory transistors $Q_{ij}$ has a source region and a drain region having asymmetrical structures.

The EPROM according to the embodiment has a structure in which four memory transistors $Q_{ij}$ are arranged in an X-character shape while commonly using the source region or drain region. The wirings $(BL/CL)_i$ which are used as bit lines or common lines are in contact with the common source region or drain region of the four memory transistors $Q_{ij}$. Such a contact portion is indicated by "." in FIG. 1.

Figure 3:
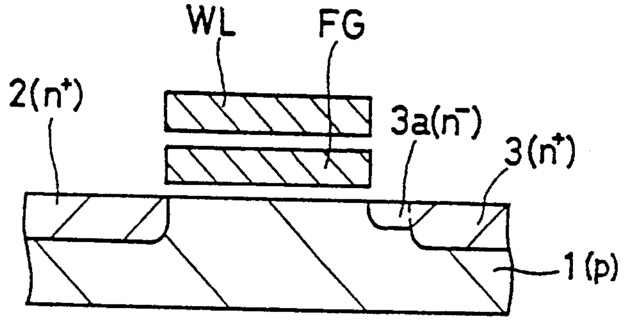
FIGS. 3 and 4 are cross sectional views showing examples of structures of memory transistors which are used in the EPROM according to the embodiment of the invention.
Figure 4:
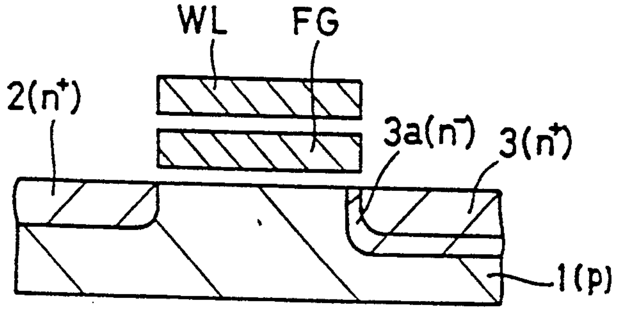

FIGS. 3 and 4 show examples of structures of the memory transistors $Q_{ij}$ which are used in the embodiment.

In FIGS. 3 and 4, reference numeral 1 denotes a semiconductor substrate such as a p type Si substrate; FG indicates a floating gate formed on the semiconductor substrate 1 through a gate insulating film (not shown); and WL represents a word line laminated on the floating gate FG through an insulating film (coupling insulating film) (not shown). Reference numeral 2 denotes a semiconductor region which is used as a source region or a drain region and comprises, for example, an $n^+$ type high impurity concentration region. Reference numeral 3 denotes a semiconductor region comprising, for instance, an $n^+$ type high impurity concentration region. Reference numeral 3a denotes, for example, an $n^-$ type low impurity concentration region. The semiconductor region 3 and the low impurity concentration region 3a are used as a source region or a drain region.

In the example of the structure shown in FIG. 3, the low impurity concentration region 3a is formed in an edge portion of the semiconductor region 3 comprising the high impurity concentration region on the side of the floating gate FG. On the other hand, in the example of the structure shown in FIG. 4, the low impurity concentration region 3a is formed so as to surround the semiconductor region 3 comprising the high impurity concentration region.

The operation of the EPROM according to the embodiment constructed as mentioned above will now be described. For instance, the case where the writing and reading operations of data are executed for the memory cell comprising the memory transistor $Q_{21}$ will now be described here.

In the writing mode, the semiconductor region 3 and the low impurity concentration region 3a of the memory transistor $Q_{21}$ are used as a source region, while the semiconductor region 2 is used as a drain region. In this case, the wiring $(BL/CL)_2$ connected to the regions 3 and 3a is used as a common line. The wiring $(BL/CL)_1$ connected to the semiconductor region 2 is used as a bit line. The positive program voltage $V_{pp}$ is applied to the wiring $(BL/CL)_1$ which is used as a bit line, accordingly, the semiconductor region 2 as a drain region and the word line $WL_2$ which is used as a control gate. On the other hand, the wiring $(BL/CL)_2$ which is used as a common line, accordingly, the semiconductor region 3 and low impurity concentration region 3a as a source region and the semiconductor substrate 1 are set to a ground power source potential $V_{ss}$. In this case, electrons flow into the semiconductor region 2 as a drain region from the semiconductor region 3 and low impurity concentration region 3a as a source region. Hot electrons are injected into the floating gate FG and data is written.

In the reading mode, the semiconductor region 2 is used as a source region and the semiconductor region 3 and low impurity concentration region 3a are used as a drain region. In this case, the wiring $(BL/CL)_1$ connected to the semiconductor region 2 is used as a common line. The wiring $(BL/CL)_2$ connected to the regions 3 and 3a is used as a bit line. A positive reading voltage $V_{cc}$ is applied to the wiring $(BL/CL)_2$ which is used as a bit line, accordingly, the regions 3 and 3a as a drain region. A positive voltage $V_{cc}'$ is applied to the word line $WL_2$ which is used as a control gate. On the other hand, the wiring $(BL/CL)_1$ which is used as a common line, accordingly, the semiconductor region 2 as a source region and the semiconductor substrate 1 are set to the ground power source potential $V_{ss}$. In this case, electrons flow into the regions 3 and 3a as a drain region from the semiconductor region 2 as a source region and are detected as a current flowing in the wiring $(BL/CL)_2$, so that data is read out.

As described above, according to the embodiment, the memory transistor in which the source region and the drain region have asymmetrical structures as shown in FIG. 3 or 4 is used. In the writing mode, the semiconductor region 2 comprising the high impurity concentration region of the memory transistor is used as a drain region. The wiring $(BL/CL)_i$ connected to the region 2 is used as a bit line. Therefore, the hot carriers are likely to be injected into the floating gate FG by an effect of the field concentration in the portions near the semiconductor region 2 as a drain region, so that a good writing characteristic can be obtained.

On the other hand, in the reading mode, the semiconductor region 3 comprising a high impurity concentration region and the low impurity concentration region 3a are used as a drain region The wiring $(BL/CL)_i$ connected to the regions 3 and 3a are used as a bit line. Therefore, the injection of hot carriers into the floating gate FG is hardly executed due to the effect of the field relaxation in the portions near the drain region by the low impurity concentration region 3a. Thus, the soft write hardly occurs and the reading reliability of the EPROM can be improved.

Since the EPROM of the embodiment has an X-cell structure in which the memory cells are arranged in an X-character shape, a high integration density of the memory cells can be realized.

In an EPROM which does not use the X-cell structure, in the case of using a method whereby the source region and the drain region of the memory transistor have the asymmetrical structures as mentioned above and the wirings $(BL/CL)_i$ are used as bit lines or common lines, the number of contact portions of the wirings $(BL/CL)_i$ per bit is increased to a double number, resulting in an obstacle when a high integration density of the memory cells is realized. According to the embodiment, however, since the memory cells have an X-cell structure as mentioned above, the number of contact portions of the wirings $(BL/CL)_i$ is equal to that in the case of the ordinary EPROM and there is no obstacle when realizing a high integration density of the memory cells.

Figure 5:
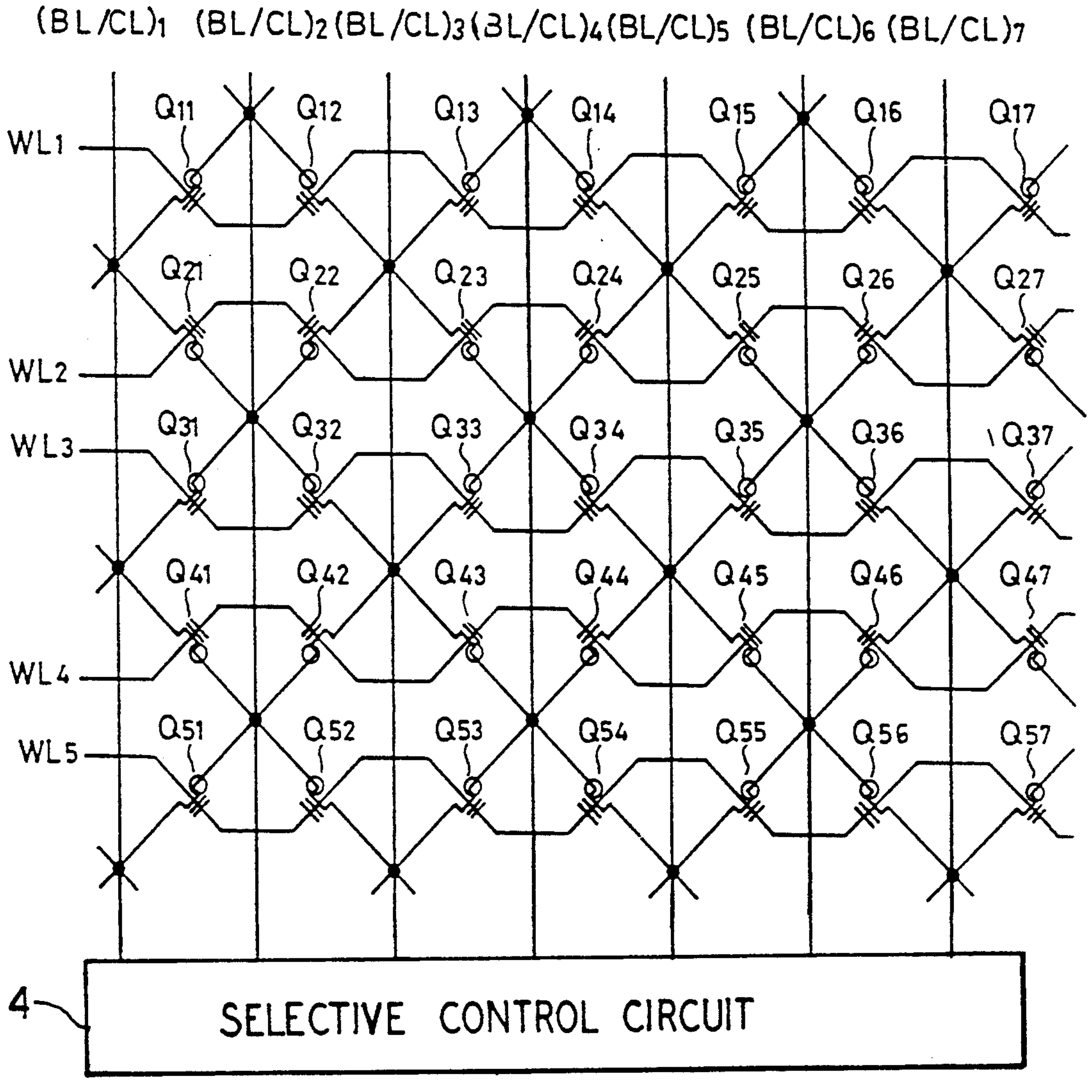
FIG. 5 is a schematic diagram showing a structure of an EPROM according to an embodiment of the invention and further illustrating the circuit for selectively controlling the BL/CL lines.

Referring to FIG. 5, a selective control circuit 4 is illustrated. The circuit 4 selectively controls the functioning of the first column lines as ground lines during writing and selectively controls the functioning of the second column line as ground lines during reading. That is, in the data writing mode, one of the semiconductor regions is used as a source region and in the data reading mode, one of the semiconductor regions is used as a drain region.

Having described a specific preferred embodiment of the present invention with reference to the accompanying drawings, it is to be understood that the invention is not limited to the precise embodiments, and that various changes and modifications may be effected therein by one skilled in the art without departing from the scope or the spirit of the invention as defined in the appended claims.

According to the invention, it is possible to realize a non-volatile semiconductor memory having an excellent writing characteristic, a high reading reliability, and a large capacity.

What is claimed is:

1. An electrically programmable memory device comprising:

a plurality of memory cells formed in a semiconductor substrate and arranged in rows and columns so as to form an X-character shape array, each cell including a control electrode and a first region and a second region having a conductivity type different from that of said substrate, said first region having a higher impurity concentration region and a lower impurity concentration region, said second region having a higher impurity concentration region;

a plurality of row lines wherein the control electrode of each cell in each row being coupled to the row line, each row of said cells storing bits from a plurality of data lines; and alternate first and second column lines, the first region and the second region of each cell in each column being coupled to said first column line and said second column line, respectively, said first column lines selectively functioning as ground liens for inputting data during a data writing mode, and further said first column lines functioning as bit lines and said second column lines selectively functioning as ground lines for outputting data during a data reading mode.

2. The electrically programmable memory device according to claim 1, wherein said lower impurity concentration region of said first region is formed in an edge portion of said higher impurity concentration region of said first region.

3. The electrically programmable memory device according to claim 1, wherein said lower impurity concentration region of said first region is formed so as to surround said higher impurity concentration region of said first region.

* * * * *